United States Patent [19]

Delapierre

[11] 4,385,283
[45] May 24, 1983

[54] APPARATUS FOR MONITORING AND DETECTING OPERATIONAL DEFECTS IN THE STATE OF VEHICLE LAMPS

[75] Inventor: Gilles Delapierre, Seyssinet, France

[73] Assignee: Commissariat a l'Energie Atomique, Paris, France

[21] Appl. No.: 163,072

[22] Filed: Jun. 26, 1980

[30] Foreign Application Priority Data

Jun. 6, 1979 [FR] France ................ 79 14453

[51] Int. Cl.³ .................... G01R 31/02; G01R 19/15
[52] U.S. Cl. .................... 340/52 R; 324/51; 340/642
[58] Field of Search ................ 324/51, 101, 117 R, 324/117 H, 252, 414; 340/642, 643, 652, 52 R, 651, 664; 315/129

[56] References Cited

U.S. PATENT DOCUMENTS

| | | | |
|---|---|---|---|
| 2,946,955 | 7/1960 | Kuhrt | 324/117 H X |
| 3,355,601 | 11/1967 | Klein | 340/642 X |
| 3,532,928 | 10/1970 | West | 340/642 X |
| 3,535,626 | 10/1970 | Uemura et al. | 324/252 |
| 3,671,809 | 6/1972 | Ryan et al. | 340/651 X |
| 3,898,513 | 8/1975 | Kopernik et al. | 340/642 X |
| 4,075,671 | 2/1978 | Cheatham et al. | 324/252 X |
| 4,097,802 | 6/1978 | Mahopac | 324/252 |

OTHER PUBLICATIONS

Bajorek et al., Magnetoresistive Current Sensor, IBM Tech. Discl. Bull., vol. 18, No. 8, pp. 2745–2748, Jan. 1976.
Knickmeyer, K. H., Magnetoresistive Detection Apparatus, IBM Tech. Discl. Bull., vol. 18, No. 8, Jan. 1976, pp. 2565, 2566.

Primary Examiner—Gerard R. Strecker
Attorney, Agent, or Firm—Michael N. Meller; Anthony H. Handal

[57] ABSTRACT

Process for monitoring the instantaneous or momentary state of an electric circuit having to function in a range limited to two states, namely a normal state corresponding to the passage of a nominal intensity in a conductor and a critical or threshold state corresponding to a threshold intensity and in particular a zero intensity in the said conductor, using the detection of possible variations in the resistance of a magnetic layer or "magnetoresistor" of the influence of the magnetic field due to the intensity of the electric current circulating in a conductor and whereof part of the path is located in the vicinity of at least one oriented thin magnetic layer, wherein the said detection is carried out by means of a differential measurement of the magnetoresistance of at least two adjacent and separate magnetic layers, whereof one is subject to the field of the circuit to be monitored and the other is subject to the field of a reference current, the circuits and layers being arranged also in such a way as to be independent of the variations in the magnetoresistance due to ambient variations of temperature and/or magnetic field.

The invention also relates to the application of the process to the monitoring of the possible breaking state of the supply circuits of electric lamps of a motor vehicle.

2 Claims, 1 Drawing Figure

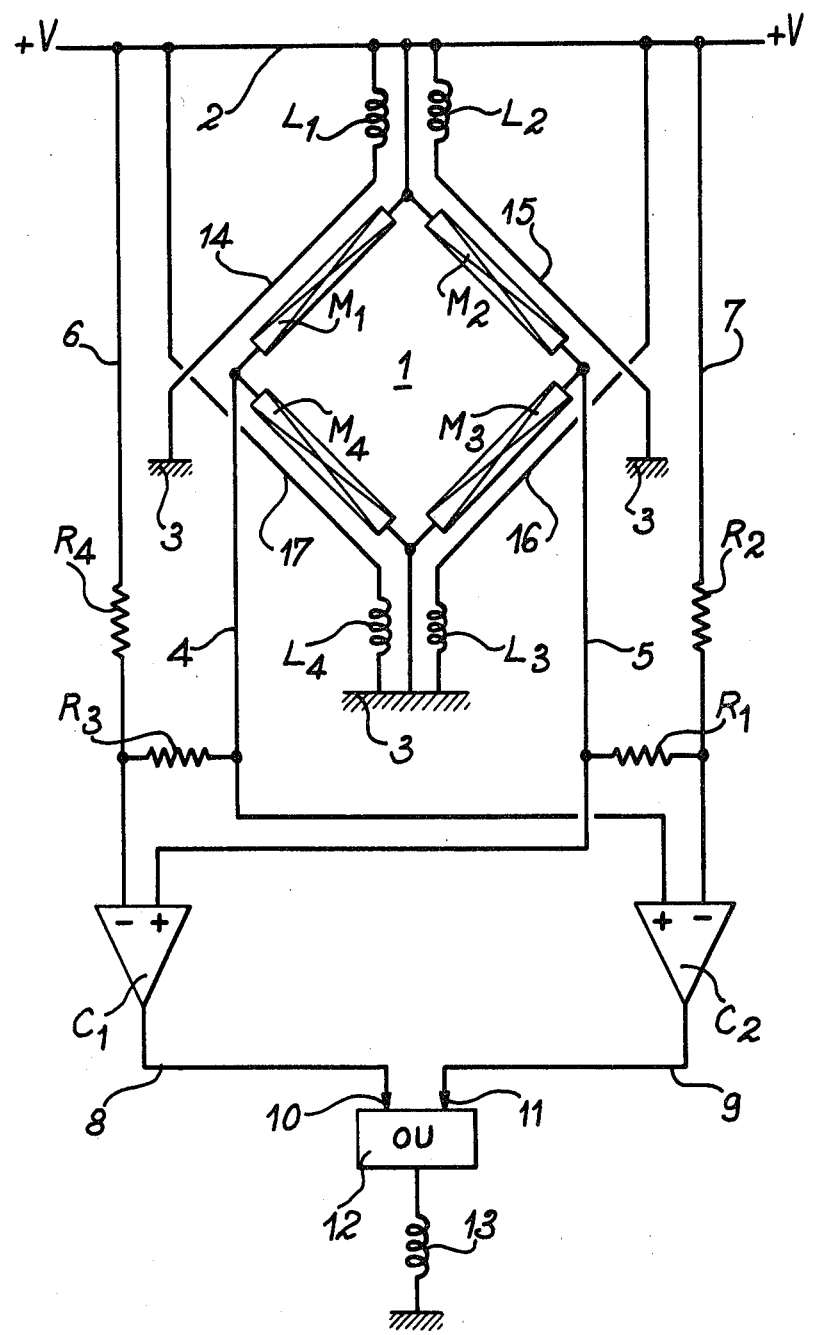

APPARATUS FOR MONITORING AND DETECTING OPERATIONAL DEFECTS IN THE STATE OF VEHICLE LAMPS

BACKGROUND OF THE INVENTION

The present invention relates to the monitoring of the instantaneous of momentary state of an electric circuit able to operate in a limited range of two states, namely a normal state corresponding to the passage in a given conductor of the substantially nominal intensity and a critical or threshold state corresponding to the passage of a so-called threshold intensity in the said conductor. It applies more particularly to the case where the threshold intensity is zero and corresponds to the disconnection of the conductor. In this particular case, the process of the invention behaves in a manner of a process for the detection and signalling or notifying of the breaking of an electric circuit supplied with alternating or direct current. A particularly interesting application of a process of this type is in the detection of the breaking of filaments of electric lamps on a motor vehicle. In the remainder of the text, reference will more particularly be made to the latter application, although this is not limitative and many other circuits can be monitored at the same time.

In automobile technology, different systems have already been used for detecting as rapidly as possible the failure of one of the electric lamps constituting the equipment of a vehicle. The presently known systems comprise measuring either the voltage variations at the terminals of a resistor inserted in series in the supply circuit of a lamp to be monitored, or the variation in the permeability of a magnetic material under the action of a magnetic field created by the electric current passing through one of the conductors of the aforementioned circuits.

The first system requires the insertion into the circuit of one or more resistors having a perfectly controlled value which is sufficiently low that it does not dissipate too much power and sufficiently high to still give a usable signal. Systems of this type generally have the serious disadvantage of being unable to withstand the short-circuits of the member being monitored, the inserted resistors then acting as a fuse. This is a serious disadvantage, because whenever there is an intensity overload in the monitored circuit, it is necessary to envisage changing not only the member responsible for the overload but also the monitoring resistors which, due to the necessary high precision thereof, cannot be standard low cost articles.

The system based on the variation of the magnetic permeability of a probe has the disadvantage of requiring an alternating current excitation signal which it is necessary to produce especially because such a current does not necessarily exist on all automobiles. In addition, such systems are generally made from a solid magnetic material having the shape of a torus with a well controlled magnetization curve and in which there are one or more coils. They are relatively cumbersome and costly, particularly in the case when numerous members have to be monitored, as occurs on an automobile where there can be easily a total of a dozen electric lamps.

The present invention relates to a process for monitoring the instantaneous or momentary state of an electric circuit which solves in a simple and inexpensive manner the aforementioned problems. To this end, the invention uses an apparatus having magnetoresistors placed in the vicinity of a conductor traversed by the current to be monitored.

Procedures using such means are already known and are described more particularly in: U.S. Pat. No. 2,946,955 of July 26th 1960 entitled "Measuring apparatus comprising a magnetic field-responsive resistor as a condition-responsive element" and the article by K. H. KNICKMEYER, published in the I.B.M. Technical Disclosure Bulletin, Vol. 18, No. 8, January 1976, p. 2565 entitled "Magnetoresistive detection apparatus".

The apparatus described in the U.S. Patent uses the Hall effect or the magnetoresistance of semiconductors of the III-V group well known for their high mobility of their carriers (70,000 $cm^2/Vs$) and therefore their good qualities as magnetosensitive detectors. However, if it is recalled that at 1 mm from the axis of a conductor traversed by a current of 1A, the field is 20 $e$, the highest signals which can be expected with the most sensitive transducer of the type described in the said patent (type SV 130/I) is 0.35 mV. This is a very weak signal and in addition it constitutes an upper limit, because the smallest dimensions of the transducer being 4 mm the latter cannot be placed 1 mm from the conductor. Moreover, the materials used are very temperature-sensitive and no solution is proposed for solving this problem. The interference fields are entirely taken into account by the apparatus and appear to be the equivalent of a current. These problems limit the field of application of such apparatus to high currents, such as for example, those of electrolytic cells.

The system described in the I.B.M. Bulletin uses at least two magnetoresistors for measuring a single current. In the case of monitoring 4 bulbs, e.g. in a vehicle, it is necessary to have 4 bridges and 4 amplifiers. Moreover, the structure described does not make it possible to obtain independence of the influence of interference fields. Thus, any fields superimposed on the field created by the current to be measured, particularly the earth field, cannot be distinguished from the field to be measured. Finally, the temperature compensation is brought about only as a result of numerous complications. To this end, it is necessary to use two magnetoresistors which vary in the same way as a function of the temperature, but in opposite directions as a function of the field applied. However, the magnetoresistance is only sensitive to the amplitude of the field and not to its direction. To obtain a resistance variation dependent on the direction of the field, it is necessary to apply a polarization field corresponding to a 45° magnetization rotation. Thus, the transducer response is significantly linked with the stability of the polarization point. However, if it is desired to retain a significant sensitivity, the polarization field is necessarily of the same order of magnitude as the field to be measured and consequently the earth field in certain cases. Such a system can only be used in conjunction with precise and therefore expensive shielding systems.

BRIEF SUMMARY OF THE INVENTION

The invention relates to a process obviating all these disadvantages. Differential comparison takes place between the influence of the current to be monitored on a magnetoresistor and the influence of a reference current on another magnetoresistor. Each of the magnetoresistors reacts in an identical manner to temperature and external fields. The only possible cause of asymmetry of the apparatus is therefore the breaking of one of the currents. This is particularly advantageous in the monitoring of the bulbs of a vehicle where each lamp serves as a reference for its symmetry.

More specifically, the present invention relates to a process for monitoring the instantaneous or momentary state of an electric circuit having to function in a range limited to two states, namely a normal state corresponding to the passage of a nominal intensity in a conductor and a critical or threshold state corresponding to a threshold intensity and in particular a zero intensity in the said conductor, using the detection of possible variations in the resistance of a magnetic layer or "magnetoresistor" of the influence of the magnetic field due to the intensity of the electric current circulating in a conductor and whereof part of the path is located in the vicinity of at least one oriented thin magnetic layer, wherein the said detection is carried out by means of a differential measurement of the magnetoresistance of at least two adjacent and separate magnetic layers, whereof one is subject to the field of the circuit to be monitored and the other is subject to the field of a reference current, the circuits and layers being arranged also in such a way as to be independent of the variations in the magnetoresistance due to ambient variations of temperature and/or magnetic field.

The process according to the invention uses, for example, the magnetoresistance of thin layers of FeNi deposited in vacuo. Such layers, evaporated in the presence of a magnetic field of a few Oersteds then have in a permanent manner a so-called easy magnetization direction parallel to the said field. This means that in the absence of any external field the magnetization of the layer is parallel to said direction. If, however, an external field Ha perpendicular to said direction is applied to the layer, the magnetization rotates by an angle $\theta$ such that:

$$\sin \theta = Ha/Hk \text{ if } Ha < Hk$$

$$\sin \theta = 1 \text{ if } Ha > Hk$$

in which Hk is the so-called anisotropy field.

As a function of the preparation conditions, Hk can vary from 1.5 to 5 Oe or higher. For existing applications of the process forming the subject matter of the invention, the field Hk is preferably equal to 2 Oe.

The physical phenomena of interest for the invention is that this rotation of the magnetization is accompanied by a variation $\Delta \rho$ of the resistivity $\rho$ of the material according to the law $$\Delta \rho = \Delta \rho_{max} \cos^2 \theta$$

$\rho$ being maximum for Ha=0. For an FeNi layer, we typically obtain $(\Delta \rho_{max}/\rho) \approx 3\%$.

If such a thin layer is positioned 1 mm from the centre of a conductor traversed by a current of intensity I measured in Amperes, the applied magnetic field is approximately 2 Oe/A. Thus, we obtain $\Delta \rho \approx \Delta \rho_{max}$ for a current of approximately 1 A, which is the order of magnitude of interest for numerous applications. If the magnetoresistance is for example 100 $\Omega$ (a value is very easy to obtain) for a polarization current of 20 mA (dissipated power 40 mW) we obtain a $\Delta V_{max} = I.\Delta R \approx 60$ mV. Such a value is well above the minimum necessary for controlling a comparator circuit, even when the latter is very inexpensive.

It is also possible to allocate each of the different thin layers to the monitoring of a particular circuit which makes it possible, whilst retaining the advantages of differential measurements, a simultaneous monitoring of two or an even number of circuits. A particularly interesting case of application of said variant of the process consists of using four oriented thin magnetic layers arranged in accordance with the four branches of a Wheatstone bridge, each of the said four branches ensuring the monitoring of a particular electrical circuit. The elements constituting and supplying the Wheatstone bridge are then regulated so that the bridge is balanced when the circuits to be monitored are traversed by their normal intensity and the passage is one of the circuits of said nominal intensity at a threshold intensity, which can be zero in the case where it is desired to locate an interruption, causes an unbalance of the bridge which it is merely necessary to detect. In order to do this, it is possible to use any method known to the Expert. However, it is advantageous according to the invention to use two comparators having a logic output, whereof each has one of its inputs connected to the outputs to be monitored of the Wheatstone bridge, the two outputs of said comparators supplying the input of an OR circuit which itself supplies an output signal if, as a result of an unbalance of the bridge, one of the comparators supplies an output signal.

A particularly interesting application of the process of the invention is the detection of breaks in the supply circuits of lamps on motor vehicles. If it is found that on such a vehicle the lamps almost always operate in pairs, whereas they only fail one at a time, by means of a single differential measurement using a Wheatstone bridge it is possible to control two or four lamps at once and in fact even six or eight lamps. The Wheatstone bridge structure also has the advantage of automatically compensating any variation of $\rho$ due to the ambient temperature and/or ambient magnetic field, because the magnetoresistors provided at the same time on the same substrate vary in the same way.

DESCRIPTION OF THE DRAWING AND PREFERRED EMBODIMENTS

The invention will be better understood from reading the following description of a non-limitative embodiment of the process for monitoring the state of a circuit, with reference to the single drawing which shows a possible circuit diagram for performing the process for monitoring the possible breaking of the supply circuits of electric lamps on a motor vehicle.

The Wheatstone Bridge 1 has four magnetoresistors $M_1$, $M_2$, $M_3$ and $M_4$, which are equal then in pairs, i.e. for which $M_1 = M_2$ and $M_3 = M_4$ or more generally such that $M_1 M_3 = M_2 M_4$. This Wheatstone bridge is supplied between the anode 2 at voltage $+V$ and at earth. The state of balance or unbalance of the bridge is therefore measured in conventional manner between outgoing conductors 4 and 5 leading to the opposite diagonal of the Wheatstone bridge. The drawing shows four lamps $L_1$, $L_2$, $L_3$ and $L_4$ belonging to the same vehicle and supplied separately in each case between conductor 2 at potential $+V$ and earth 3. On modern automobiles, the electric lamps are generally distributed in the form of pairs of identical lamps corresponding on the one hand to the right-hand side and on the other to the left-hand side of the vehicle. Thus, it is relatively easy to balance such a Wheatstone bridge by grouping lamps $L_1$ and $L_4$ corresponding to the left side and $L_2$ and $L_3$ corresponding to the right side in symmetrical manner with respect to the four branches of the bridge. Four resistors $R_1$, $R_2$, $R_3$ and $R_4$ make it possible to ensure an appropriate polarization of the two negative inputs of logic comparators $C_1$ and $C_2$ in such a way that those whose positive terminal is supplied by one of the conductors 4 or 5 from the Wheatstone bridge supplies at the output the zero signal when the bridge is in a balanced state. To this end, resistor $R_4$ is located on conductor 6 which connects the negative input of comparator $C_1$ to terminal 2 and resistor $R_2$ is located on conductor 7 which connects the negative input of comparator $C_2$ to the same terminal 2. A resistor $R_3$ connects the conductors 4 and 6 and a resistor $R_1$ connects the conductors 5 and 7.

The output 8 of comparator $C_1$ and the output 9 of comparator $C_2$ are respectively connected to input 10 and input 11 of the OR circuit 12. Thus, output 13 of said OR circuit is at "0" if no logic signal appears at outputs 8 and 9 of comparators $C_1$ and $C_2$. However, it supplies a signal "1" if one of the two outputs 8 or 9 itself supplies a signal equal to 1.

Each of the conductors 14, 15, 16 and 17 of the supply circuits for lamps $L_1$, $L_2$, $L_3$ and $L_4$ is positioned in the immediate vicinity of one of the four magnetoresistors $M_1$, $M_2$, $M_3$ and $M_4$ in such a way that the latter can be continually dependent on the magnetic field created by the current circulating in each of the lamps. Bridge 1 is regulated so as to be balanced when no current is present in lamps $L_1$, $L_2$, $L_3$ and $L_4$. When lamps $L_1$ and $L_2$ and/or $L_3$ and $L_4$ are ignited, the bridge remains balanced because we maintain $M_1M_3=M_2M_4$ either because the currents are equal in $L_1$ and $L_2$ and/or in $L_3$ and $L_4$, or because they are unequal but sufficient to give $Ha > Hk$. However, if any one of the random lamps is out of use, the bridge 1 is unbalanced, the output of $C_1$ or $C_2$ passes into state "1" and the alarm is triggered.

The system has been described for two or four lamps, but numerous combinations make it possible to increase the figure to six or eight or even more lamps. Thus, either each magnetoresistor can be subdivided into two magnetoresistors in parallel or in series, or it is possible to have two conductors in front of the same magnetoresistor.

In the latter case, it is advantageous if the sum of the fields created by the two currents, which are preferably close to one another, gives $\theta \approx 90°$ or preferably $\theta \approx 0°$ with two equal and opposed currents. It is also possible to act on the width of the magnetoresistor and therefore the demagnetizing field opposing the field applied to adjust the value of the field giving $\Delta\rho_{max}$.

The above description has related to a direct current circuit, but the apparatus can also be used with alternating currents. In the case of disconnection of one of the conductors 14, 15, 16 and 17 an alternating signal which can supply e.g. an indicator light is then obtained at the output of comparators $C_1$ and $C_2$.

Thus, a detector which monitors apparatus at once can be obtained with an extremely simple system constituted by a thin layer and a commercially available integrated circuit. In addition, this apparatus can also be installed on an existing circuit. Thus, in a practical realisation of the detector, it is possible, for example, to directly connect the chip of the integrated differential detection circuit to the thin layer.

What is claimed is:

1. An apparatus for detecting the breaking of one of the filaments of a plurality of vehicle lamps, comprising means for arranging said lamps for monitoring in pairs, including one pair of lamps disposed on the left side of the vehicle and another pair of said lamps identical to said one pair of said lamps and disposed on the right side of the vehicle, first conductor means adapted for supplying energizing current individually to the lamps in each pair, a Wheatstone bridge comprising four oriented thin magnetic layers, each of said layers being connected in a respective branch of said bridge for detecting a change in the intensity of current flowing in an adjacent conductor by a differential variation of the resistivity of the magnetic material of said layer, second conductor means adapted for supplying energizing current to said Wheatstone bridge, each one of the four conductor means associated with said two pairs of lamps is disposed in the immediate vicinity of one of said four oriented thin magnetic layers of said Wheatstone bridge normally balanced when each of the energizing current intensities are present at normal magnitude, the imbalance of the bridge indicating the breaking of the filament of one of the lamps of the two pairs.

2. The apparatus as claimed in claim 1, wherein each lamp is arranged in an individual energizing branch between a positive supply bus of the energy source of the vehicle and ground on said vehicle, the output of a predetermined pair of said thin magnetic layers forming a half of the bridge and connected to one input of an associated one of a pair of comparator means, the other input of said comparator means being returned to said positive bus of said source and balanced thereby when predetermined energizing current flows through the pair of lamps associated with one pair of said magnetic layers of the bridge; and an "OR" circuit connected to the output of the pair of comparator means and having an output means indicative of the input of one of said comparator means producing an output thereby.

* * * * *